(12) United States Patent
Steinbach et al.

(10) Patent No.: US 9,324,767 B1
(45) Date of Patent: Apr. 26, 2016

(54) SUPERCONDUCTING JUNCTIONS

(71) Applicant: Intermolecular, Inc., San Jose, CA (US)

(72) Inventors: Andrew Steinbach, San Jose, CA (US); Tony Bonetti, Pleasanton, CA (US); Frank Greer, Pasadena, CA (US); Kurt Pang, Fremont, CA (US); Yun Wang, San Jose, CA (US)

(73) Assignee: Intermolecular, Inc., San Jose, CA (US)

( * ) Notice: Subject to any disclaimer, the term of this patent is extended or adjusted under 35 U.S.C. 154(b) by 149 days.

(21) Appl. No.: 14/145,410

(22) Filed: Dec. 31, 2013

(51) Int. Cl.
*H01L 29/06* (2006.01)
*H01L 27/18* (2006.01)
*H01L 23/532* (2006.01)

(52) U.S. Cl.
CPC .......... *H01L 27/18* (2013.01); *H01L 23/53276* (2013.01)

(58) Field of Classification Search
CPC ... H01L 39/2493; H01L 43/08; H01L 39/223; H01L 2924/0002; H01L 43/12; H01L 27/18; H01L 39/00; H01L 35/225; H01L 39/226; B82Y 10/00; B82Y 25/00; G01J 1/42; G01J 5/20; Y10S 428/93; Y10S 505/70; Y10S 505/723; Y10S 505/846; H01F 6/00; H01F 6/06; G01R 33/05; G01R 33/3815
USPC ................................ 257/31, 34, 661, E39.014
See application file for complete search history.

(56) References Cited

U.S. PATENT DOCUMENTS

| | | | |
|---|---|---|---|
| 5,399,881 A | 3/1995 | Bozovic et al. | |
| 7,449,345 B2 | 11/2008 | Horng et al. | |
| 7,598,579 B2 | 10/2009 | Horng et al. | |
| 8,119,424 B2 | 2/2012 | Mather et al. | |
| 2003/0128919 A1* | 7/2003 | Weiss | B82Y 20/00 385/25 |
| 2005/0062131 A1* | 3/2005 | Murduck | H01C 7/006 257/536 |
| 2007/0194225 A1* | 8/2007 | Zorn | B82Y 35/00 250/306 |
| 2008/0070325 A1* | 3/2008 | Tolpygo | H01L 39/025 438/2 |
| 2009/0057652 A1* | 3/2009 | Nevirkovets | B82Y 10/00 257/35 |
| 2011/0163455 A1* | 7/2011 | Gaidis | H01L 21/76886 257/773 |
| 2013/0001668 A1 | 1/2013 | Frank | |

FOREIGN PATENT DOCUMENTS

JP 02217469 A 8/1990

OTHER PUBLICATIONS

Ritala et al.; Atomic Layer Deposition of Oxide Thin Films with Metal Alkoxides as Oxygen Sources; Apr. 14, 2000; Science AAAS, vol. 288; pp. 319-321.
Lu et al.; Fabrication of Nb/Al2O3/Nb Josephson Junctions Using in situ Magnetron Sputtering and Atomic Layer Deposition; Oct./Nov. 2012; IEEE/CSC & ESAS European Superconductivity News Forum, No. 22; pp. 1-5.

* cited by examiner

*Primary Examiner* — Yosef Gebreyesus

(57) ABSTRACT

Provided are superconducting tunnel junctions, such as Josephson tunnel junctions, and a method of fabricating thereof. A junction includes an insulator disposed between two superconductors. The junction may also include one or two interface layers, with each interface layer disposed between the insulator and one of the superconductors. The interface layer is configured to prevent oxygen from entering the adjacent superconductor during fabrication and operation of the junction. Furthermore, the interface layer may protect the insulator from the environment during handling and processing of the junction, thereby allowing vacuum breaks after the interface layer is formed as well as new integration schemes, such as depositing a dielectric layer and forming a trench in the dielectric layer for the second superconductor. In some embodiments, the junction may be annealed during its fabrication to move oxygen from the superconductors and/or from the insulator into the one or two interface layers.

20 Claims, 5 Drawing Sheets

SUPERCONDUCTING JUNCTIONS

TECHNICAL FIELD

The present disclosure relates to superconducting tunnel junctions and a method of fabricating thereof and, more specifically, to superconducting tunnel junctions having interface layers configured to prevent oxidation of superconductors during fabrication and operation of the superconducting tunnel junctions.

BACKGROUND

Josephson tunnel junctions and other types of superconducting tunnel junctions are becoming popular for various applications, such as memory cells and logic circuitry. Various materials have been investigated for junction superconductors and junction insulators. Niobium is commonly used for junction superconductors.

Niobium (Nb) is a non-critical material (the Earth's crust contains 20 ppm Nb in pyrochlore and other ores) with excellent mechanical stability. It also causes fewer diffusion problems and has a high transition temperature in comparison, for example, to lead-lead junctions. However, niobium junctions often suffer from poor quality of the insulator and oxidation of niobium used for superconductors. Specifically, forming niobium superconductors often cause degradation of insulators. The insulators are often made from oxides, and oxygen from these insulators can go into the niobium superconductors, thereby causing their oxidation. This often leads to increased single particle currents or excess currents in the voltage range below the gap voltage. As a result, the junction has a large spread in Josephson current density.

SUMMARY

Provided are superconducting tunnel junctions, such as Josephson tunnel junctions, and a method of fabricating thereof. A junction includes an insulator disposed between two superconductors. The junction may also include one or two interface layers, with each interface layer disposed between the insulator and one of the superconductors. The interface layer is configured to prevent oxygen from entering the adjacent superconductor during fabrication and operation of the junction. Furthermore, the interface layer may protect the insulator from the environment during handling and processing of the junction, thereby allowing vacuum breaks after the interface layer is formed as well as new integration schemes, such as depositing a dielectric layer and forming a trench in the dielectric layer for the second superconductor. In some embodiments, the junction may be annealed during its fabrication to move oxygen from the superconductors and/or from the insulator into the one or two interface layers.

In some embodiments, a superconducting tunnel junction includes a first layer operable as a first superconductor, a second layer operable as an insulator, a third layer operable as an interface layer, and a fourth layer operable as a second superconductor. The third layer is disposed between the second layer and the fourth layer. The second layer is disposed between the first layer and the fourth layer. The second layer comprises an oxide. In some embodiments, aluminum oxide or some other suitable insulating oxide may be used for the second layer. The third layer is configured to prevent oxygen from entering the fourth layer during fabrication and operation of the superconducting junction. In some embodiments, the third layer is operable as an oxygen barrier layer. Furthermore, the third layer may be operable as an oxygen getter layer and may get any oxygen that was unintentionally introduced into the second fourth layer, which is operable as a second semiconductor disposed adjacent to the third layer (operable as an interface layer).

In some embodiments, the superconducting junction is a Josephson tunnel junction. Various aspects of the Josephson tunnel junction are described below. In some embodiments, the first layer and the fourth layer include niobium. The second layer may include aluminum oxide. In some embodiments, the second layer may also include metallic aluminum. For purposes of this disclosure, metallic aluminum is defined as aluminum having a zero oxidation state. In some embodiments, the thickness of the second layer may be between about 0.5 nanometers and 2 nanometers.

In some embodiments, the third layer (operable as an interface layer) includes a conductive material. For example, the third layer may include one of metallic titanium or titanium nitride. In some embodiments, the third layer is configured to exchange oxygen with the second layer and to control an average oxidation state of a metal forming the oxide of the second layer. For example, the third layer may get some oxygen from the second layer during fabrication of the superconducting tunnel junction in order to reduce the average oxidation state of a metal forming the oxide of the second layer. This shift in oxygen between the second layer and the third layer may be used to effectively control the equivalent oxide thickness of the components disposed between the two superconductors.

In some embodiments, the superconducting tunnel junction also includes a fifth layer disposed between the first layer and the second layer. The fifth layer may be operable as an additional interface layer. In other words, the second layer, operable as the insulator, is disposed between two interface layers and does not directly interface either one of the superconductors.

Also provided is a method of fabricating a superconducting tunnel junction. The method may involve providing a first layer operable as a first superconductor and forming a second layer over the first layer. The second layer may be operable as an insulator of the superconducting tunnel junction. The method may proceed with forming a third layer over the second layer. The third layer may be operable as an interface layer. The method may proceed with forming a fourth layer over the third layer, which may be operable as a dielectric, and then etching a portion of the fourth layer, thereby forming a trench in the fourth layer and exposing a portion of the third layer. The method may proceed with forming a fifth layer over the fourth layer such that the fifth layer fills the trench and directly interfaces the portion of the third layer. The fifth layer is operable as a second superconductor. The second layer may include an oxide. The third layer may be configured to prevent oxygen from entering the fifth layer during fabrication and operation of the superconducting junction.

In some embodiments, at least the portion of the third layer is exposed to an oxygen containing environment prior to forming the fifth layer. For example, there may be a vacuum break in the process before the fifth layer. Even though the third layer is exposed to an oxygen containing environment, the oxygen content of the second layer may remain unchanged since it is blocked by the third layer. The oxygen containing environment may be an ambient environment outside of a processing chamber, an etching environment (e.g., an etching solution) used to etching the portion of the fourth layer, or some other environment.

In some embodiments, the method also involves annealing the superconducting junction. At the time of the annealing, at least the fifth layer directly interfaces the portion of the third layer. Furthermore, during the annealing, oxygen is transferred from the fifth layer to the portion of the third layer.

In some embodiments, forming the second layer may involve depositing a temporary layer of a metal and oxidizing the temporary layer to form the oxide. The metal of the temporary layer may be aluminum. The thickness of the second layer may be between about 0.5 nanometers and 2 nanometers. The temporary layer may be deposited using a physical vapor deposition technique. The oxidation may be performed by exposing the temporary layer to an oxygen environment.

In some embodiments, the method may also involve cleaning the trench and the portion of the third layer using a wet cleaning technique. Furthermore, the method may involve ion milling a surface of the first layer, prior to forming the second layer. In some embodiments, the method may involve, prior to forming the second layer, forming a sixth layer operable as an additional interface layer.

BRIEF DESCRIPTION OF THE DRAWINGS

To facilitate understanding, the same reference numerals have been used, where possible, to designate common components presented in the figures. The drawings are not to scale and the relative dimensions of various elements in the drawings are depicted schematically and not necessarily to scale. Various embodiments can readily be understood by considering the following detailed description in conjunction with the accompanying drawings, in which.

DETAILED DESCRIPTION OF EXAMPLE EMBODIMENTS

Figure 1:
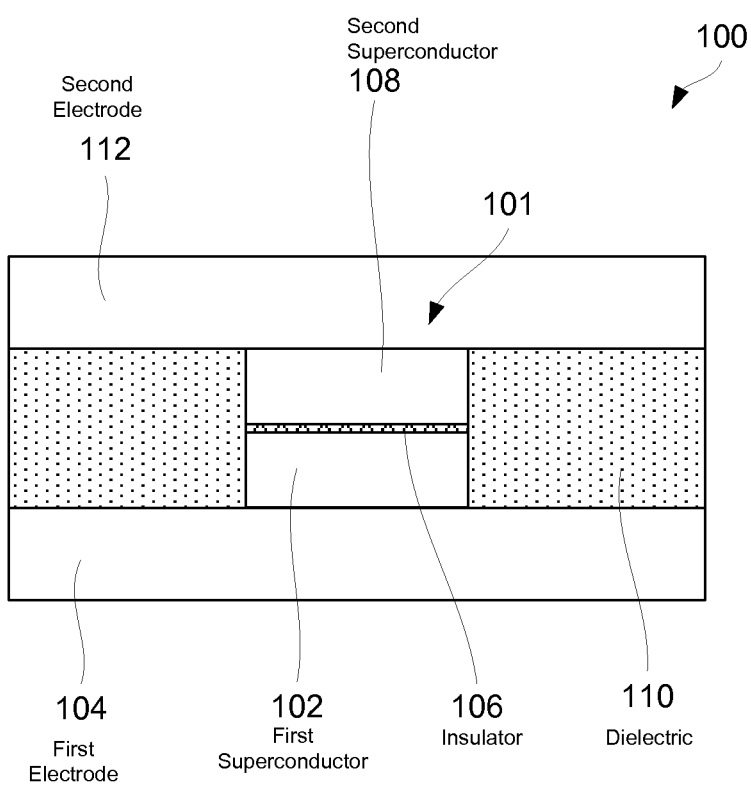
FIG. 1 is a schematic representation of a semiconductor device including a superconducting tunnel junction, in accordance with some embodiments.

In the following description, numerous specific details are set forth in order to provide a thorough understanding of the presented concepts. The presented concepts may be practiced without some or all of these specific details. In other instances, well known process operations have not been described in detail so as to not unnecessarily obscure the described concepts. While some concepts will be described in conjunction with the specific embodiments, it will be understood that these embodiments are not intended to be limiting.

Material descriptions such as "conductor," "superconductor," "semiconductor," "dielectric," and "insulator" may vary with temperature for a given material, and shall be used herein to describe the characteristics of the materials at the intended operating temperature of the device in which the materials are used. For example, "forming a superconducting layer" shall mean "forming a layer of a material expected to exhibit superconductivity at the fabricated device's intended operating temperature."

Introduction

A Josephson tunnel junction may be formed by disposing a thin layer of an insulating material between two layers of a superconducting material. The insulating material layer, which is sometimes also referred to as a barrier layer, is generally very thin. The insulating material layer (or simply "insulator") should be distinguished from interface layers that may be made from conductive materials and have no substantial impact on an equivalent oxide thickness of the tunnel junction.

In a Josephson tunnel junction, a super-current can flow across the insulator until a threshold current is reached. More specifically, electron pairs can tunnel across the insulator without any much resistance. But when the threshold current is exceeded, another voltage develops across the junction. That voltage is time-dependent and accompanied by a flow of normal current (i.e., non-superconducting current; a flow of unpaired single electrons). This in turn causes a lowering of the junction's threshold current, which results in even more normal current flow.

Various electronic circuits can employ Josephson tunnel junctions and other types of tunnel junctions. One example is a superconducting quantum interference device (SQUID). This device can be made extremely sensitive and is useful in constructing sensitive magnetometers and voltmeters (e.g., down to picovolts). A SQUID includes a loop with two Josephson junctions interrupting the loop. The SQUID may be extremely sensitive to the total amount of magnetic field that penetrates the area of the loop, and the voltage measured across the device is very strongly correlated to the total magnetic field around the loop.

Superconducting materials, such as niobium, may be sensitive to oxygen and, when oxidized, may cause malfunction of the superconducting tunnel junction. For example, a junction may be designed to operate with an insulating layer having a certain thickness. The thickness is typically within a very narrow range. When the superconducting material oxidizes at the interface of the superconducting material and the insulating layer, the thickness of the insulating layer is effectively increased because the oxide of the superconducting material is an insulating material. Oxygen may contact the superconducting material from the ambient environment, from other components of the junction, or from components adjacent to the junction. Thus, the amount of oxygen in the insulating material needs to be precisely controlled and maintained to prevent migration of excess oxygen to the electrodes, as well as to minimize defects that could cause quantum decoherence.

Overall, fabrication of a superconducting tunnel junction, such as a Josephson tunnel junction, for superconducting electronics involves forming a thin (1-2 nm in thickness) insulating layer between two superconductors. This insulating layer may be referred to as an insulator. Aluminum oxide ($Al_2O_3$) or another like material may be grown using thermal oxidation, which is often done at a room temperature. Specifically, a layer of aluminum may be deposited and then exposed to an oxygen containing material in a controlled manner. In some embodiments, the entire layer of metallic aluminum is allowed to oxidize. Alternatively, only a portion of aluminum is oxidized, while the remaining aluminum remains metallic (i.e., not oxidized). The oxidation level determines the equivalent oxide thickness and other parameters of the insulator as well as the performance of the overall tunnel junction.

Conventionally, a stack including two superconductors and an insulator disposed between the two superconductors (i.e., the first superconductor—the insulator—the second superconductor) has been formed in situ. For purposes of this document, in situ is defined as a process without vacuum break between deposition operations. Specifically, deposition of all three components is performed in the same deposition chamber without breaking the vacuum between depositions of the individual components. In situ deposition offers a way to prevent oxidation of the superconductors, but limits process integration options to the capabilities of a single process chamber (or, in some tools, to the capabilities of a connected group of process chambers sharing a common vacuum or inert-gas environment).

Process integration options have historically been further limited by the temperature sensitivity of conventional superconductor-insulator-superconductor stacks. Specifically, some of these stacks cannot be exposed to temperatures above 150° C.

Provided are superconducting tunnel junctions that include interface layers disposed between superconductors and insulators. These interface layers are configured to prevent oxygen from entering superconductors during both fabrication and operation of the junctions. Also, the interface layers may protect the insulators from the environment during handling and processing of the junctions, thereby allowing vacuum breaks after the interface layers are formed. This protection also allows new integration schemes, such as depositing a dielectric layer and forming a trench in the dielectric layer for the second superconductor.

Examples of Semiconductor Device Including Superconducting Tunneling Junctions

Prior to describing further details of interface layers, a brief description of a semiconductor device including superconducting tunnel junctions is presented to provide better understanding of various interface layer features. FIG. 1 illustrates a semiconductor device 100 including two electrodes 104 and 112 and superconducting tunnel junction 101 disposed between these electrodes 104 and 112, in accordance with some embodiments. Superconducting tunnel junction 101 is formed by first superconductor 102 and second superconductor 108, with insulator 106 disposed between first superconductor 102 and second superconductor 108. Superconducting tunnel junction 101 is surrounded by dielectric 110.

First superconductor 102 and second superconductor 108 may be formed from a refractory metal, such as niobium. Insulator 106 may be formed from aluminum oxide (e.g., by thermally oxidizing a layer of aluminum disposed on first superconductor 102). Dielectric 110 may be silicon dioxide formed by oxidation of the silicon substrate or other suitable techniques.

Conventionally, insulator 106 and second superconductor 108 are deposited as continuous layers and then patterned using lithography and etching. Specifically, a photoresist layer may be formed over the insulator 106 and second superconductor 108. The photoresist layer is patterned and etched using conventional photolithographic techniques to define the junction area. Dielectric 110 is then formed around the patterned insulator 106 and second superconductor 108. In some embodiments, at least a portion of dielectric 110 may be formed by anodizing a portion of second superconductor 108 (e.g., the portion not covered by the patterned photoresist layer).

Figure 2A:
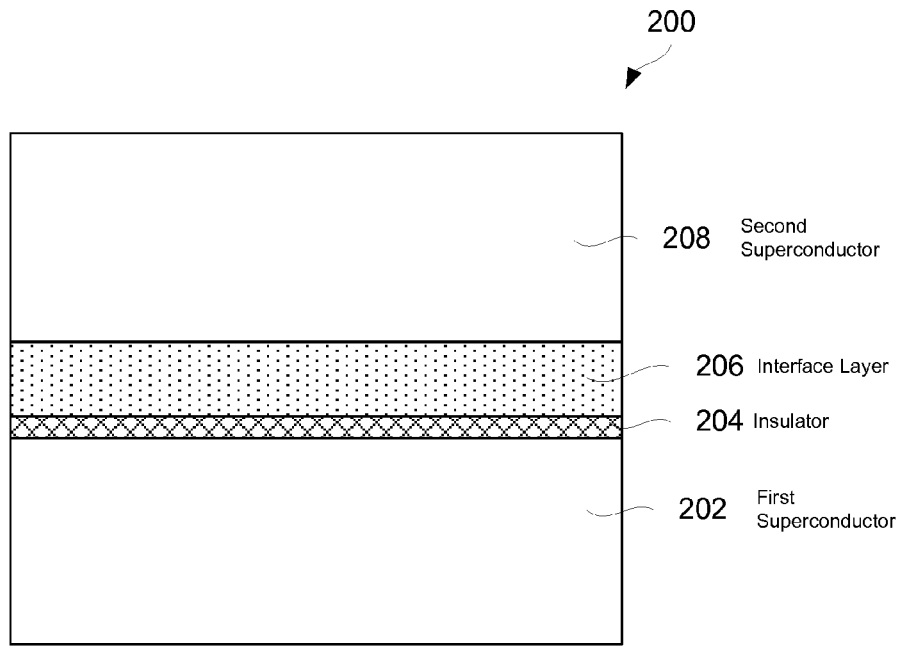
FIG. 2A is a schematic representation of a superconducting tunnel junction, in accordance with some embodiments.

FIG. 2A is a schematic representation of a superconducting tunnel junction 200, in accordance with some embodiments. Superconducting tunnel junction 200 may be a junction of a semiconductor device described above with reference to FIG. 1 or another device described below with reference to FIG. 4E. Superconducting tunnel junction 200 includes a first layer operable as a first superconductor 202, a second layer operable as an insulator 204, a third layer operable as an interface layer 206, and a fourth layer operable as a second superconductor 208. Interface layer 206 is disposed between insulator 204 and second superconductor 208, while insulator 204 is disposed between first superconductor 202 and second superconductor 208. Interface layer 206 is configured to prevent oxygen from entering second superconductor 208 during fabrication and operation of superconducting tunnel junction 200 or a device including superconducting tunnel junction 200. In some embodiments, superconducting tunnel junction 200 is a Josephson tunnel junction.

The thickness of insulator 204 may be between about 0.5 nanometers and 2 nanometers or, more specifically, between about 0.7 nanometers and 1 nanometers. In some embodiments, insulator 204 includes an oxide, such as aluminum oxide, hafnium oxide, silicon oxide, or hafnium aluminum oxide. In some examples, insulator 204 also includes metal that is not oxidized, such as metallic aluminum. For example, insulator 204 may include a combination of metallic aluminum and aluminum oxide. The ratio of an oxidized metal to the total amount of metal in insulator 204 may be between about 75% atomic and 100% atomic or, more specifically, between about 90% atomic and 100% atomic. The residual metal, which is not oxidized, may be used to control the equivalent oxide thickness of superconducting tunnel junction 200. For example, insulator 204 may be formed by thermal oxidation, in which a metal layer may be initial formed (e.g., by sputtering) in an inert environment and then oxidized in an oxygen containing environment. If the thickness of the metal layer prior to its oxidation exceeds the target thickness that would yield a target equivalent oxide thickness if the entire layer was oxidized, then the process may be configured to provide only partial oxidation of this metal layer. In this case, a resulting partially oxidized layer may yield a target equivalent oxide thickness. The thickness of the metal layer prior to its oxidation may exceed the target thickness because of difficulties in controlling the deposition process and other reasons.

In some embodiments, this partial oxidation of a metal in insulator 204 is achieved during formation of insulator 204. Alternatively, when insulator 204 is first formed, its metal may be fully oxidized. Subsequently, insulator 204 may release some oxygen into interface layer 206, which directly interfaces insulator 204, to yield a partially oxidized state of the metal in insulator 204. As such, interface layer 206 may be used to control oxidation of materials in insulator 204 and, as such, control the equivalent oxide thickness of superconducting tunnel junction 200.

In some embodiments, first superconductor 202 and/or second superconductor 208 are formed from niobium. Examples of other suitable materials may include titanium, aluminum, tantalum, vanadium, their alloys, and their nitrides, as well as ceramic and organic superconductors. Materials of first superconductor 202 and second superconductor 208 are typically susceptible to oxidation. However, this oxidation needs to be prevented to avoid unexpected changes in the equivalent oxide thickness of superconducting tunnel junction 200, which presents significant processing challenges. As described above, the process usually involves in situ processing until the entire superconducting tunnel junction 200 is formed.

As described above, interface layer 206 is configured to prevent oxygen from entering second superconductor 208 during fabrication and operation of superconducting tunnel junction 200 or a device including superconducting tunnel junction 200. In some embodiments, interface layer 206 may have a diffusion coefficient for oxygen that is less than about $10^{-9}$. Such a low diffusion coefficient may prevent the diffusion of oxygen into a superconductor, such as second superconductor 208. In some embodiments, interface layer 206 may be configured to react with excess oxygen that may be in second superconductor 208, in another component of the junction, or in the process environment, thus providing an oxygen getter for superconducting tunnel junction 200. Upon reacting with oxygen, a material included in interface layer 206 may form an oxide that is non-insulating (i.e., conductive) below a critical temperature of the superconducting layers 202 and 208. Accordingly, interface layer 206 may include conductive materials such as conductive metal oxides, conductive metal silicides, or conductive metal nitrides. For example, interface layer 206 may include one of metallic titanium or titanium nitride. In some embodiments, interface layer 206 may include a conductive oxide, such as molybdenum oxide, tungsten oxide, ruthenium oxide, rhenium oxide, chromium oxide, rhodium oxide, iridium oxide, manganese oxide, tin oxide, cobalt oxide, or nickel oxide. In some embodiments, interface layer 206 is configured to exchange oxygen with insulator 204 and to control an average oxidation state of a metal forming the oxide of insulator 204 as described elsewhere in this document.

Figure 2B:
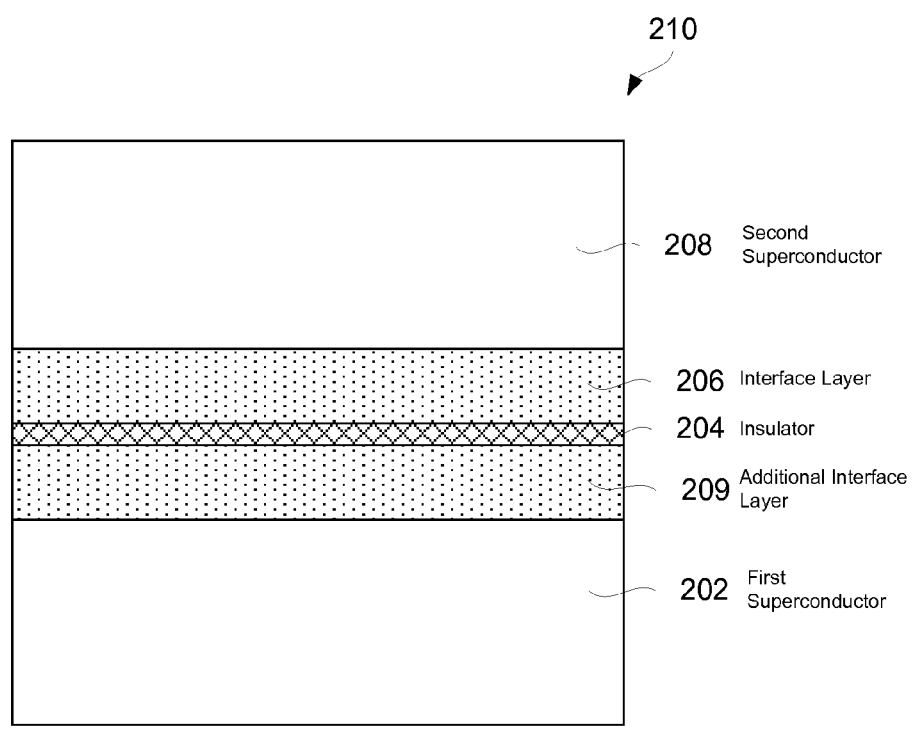
FIG. 2B is a schematic representation of another superconducting tunnel junction, in accordance with some embodiments.

FIG. 2B is a schematic representation of another superconducting tunnel junction 210, in accordance with some embodiments. Specifically, superconducting tunnel junction 210 includes an additional interface layer 209 disposed between insulator 204 and first superconductor 202. In other words, insulator 204 is disposed between interface layer 206 and additional interface layer 209 and does not directly interface first superconductor 202 or second superconductor 208.

Processing Examples

Figure 3:
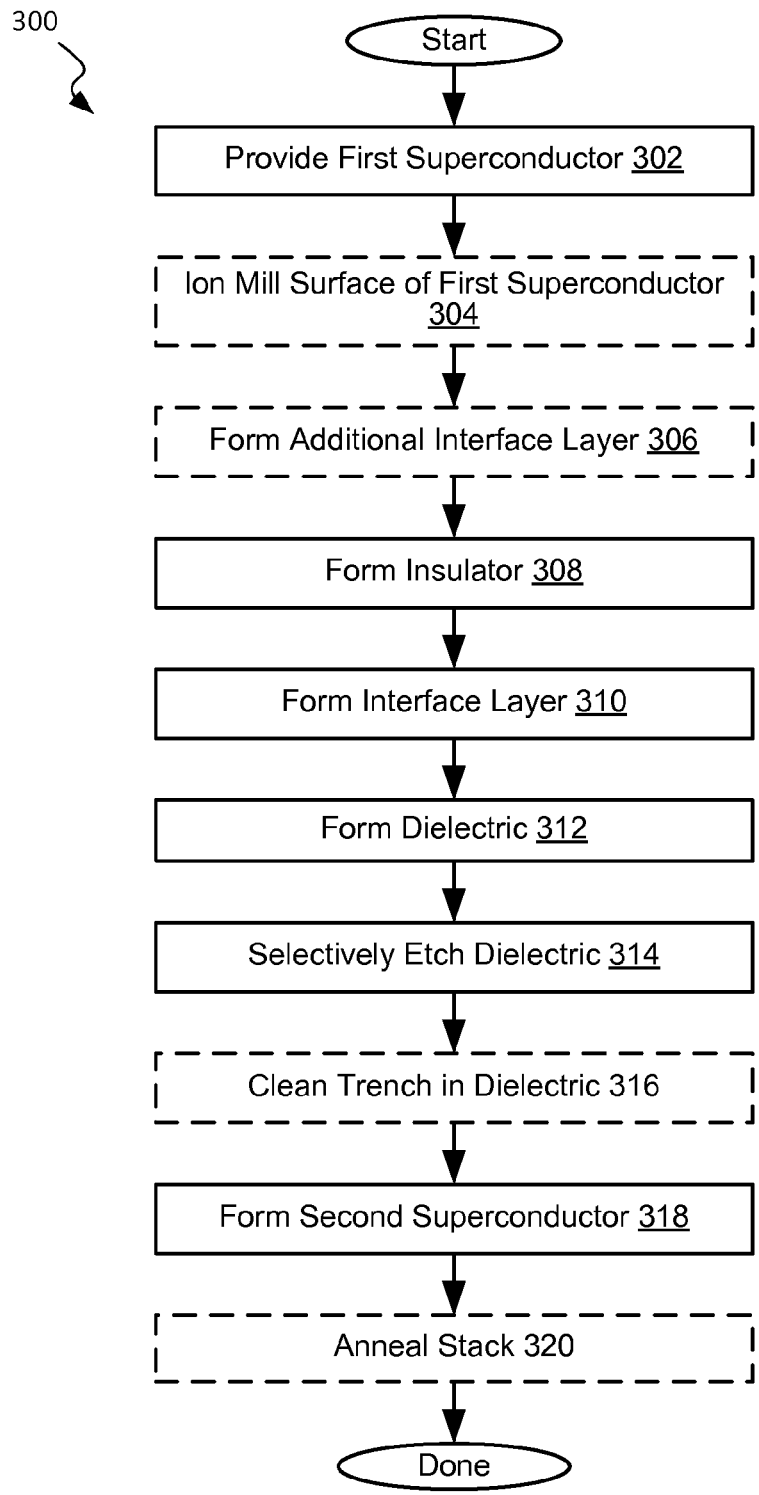
FIG. 3 is a process flowchart corresponding to a method of fabricating a superconducting tunnel junction, in accordance with some embodiments.
Figure 4A:
FIGS. 4A-4F are schematic representations of a semiconductor device during various stages of fabricating a superconducting tunnel junction, in accordance with some embodiments.

FIG. 3 illustrates a process flow chart corresponding to method 300 of fabricating a superconducting tunnel junction, in accordance with some embodiments. Method 300 may commence with providing a first layer operable as a first superconductor during operation 302. Various examples of superconductors are described above with reference to FIG. 1 and FIG. 2A. In some embodiments, the surface of the first superconductor may be subjected to ion milling during operation 304 or some other cleaning operation to remove oxides and other contaminants from the surface. FIG. 4A is a schematic representation of the first superconductor 402 after operation 302 or after operation 304.

Returning to FIG. 3, method 300 may include an optional operation 306 during which an additional interface layer is formed. This layer is formed in addition to an interface layer formed during operation 310. For example, titanium nitride may be used for the additional interface layer and/or for the interface layer. Deposition of the titanium nitride layer may be performed using a titanium target in a nitrogen atmosphere maintained at a pressure of between about 1-20 mTorr. The power density may be maintained at 3.3-11 W/cm$^2$ (150-500 Watts on a 3 inch diameter target) that may result in a deposition rate of about 0.5-5 Angstroms per second (depending on the size of the target sample and other process parameters). Some of the provided process parameters are for illustrative purposes only and generally depend on deposited materials, tools, deposition rates, and other factors.

Figure 4B:
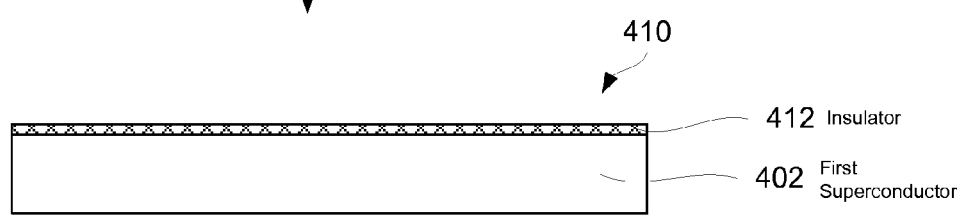

Method 300 may proceed with forming a second layer operable as an insulator during operation 308. The insulator may be formed over the first superconductor or over the additional interface layer, if one is formed during operation 306. Operation 308 may involve depositing a temporary layer of a metal using, for example, a physical vapor deposition technique and then oxidizing the temporary layer to form the oxide. FIG. 4B is a schematic representation of a partially fabricated assembly 410 including first superconductor 402 and insulator 412 after operation 308. An additional interface layer is not shown in this assembly.

Figure 4C:
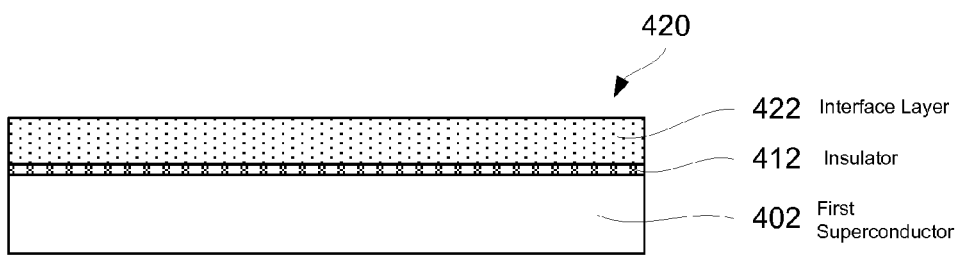

Returning to FIG. 3, method 300 may proceed with forming an interface layer during operation 310. Up to this operation, all previous operations may be performed in situ. However, after completing operation 310, a partially fabricated superconducting tunnel junction may be exposed to an oxygen containing environment. Operation 310 may be similar to operation 306 described above. FIG. 4C is a schematic representation of a partially fabricated assembly 420 including first superconductor 402, insulator 412, and interface layer 422 after operation 310.

Figure 4D:
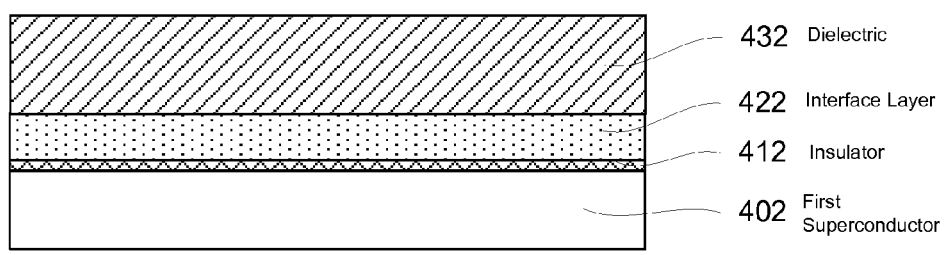

Returning to FIG. 3, method 300 may proceed with forming a dielectric during operation 312. For example, a dielectric may be silicon oxide. One having ordinary skills in the art would appreciate various techniques used to form such a dielectric. FIG. 4D is a schematic representation of a partially fabricated assembly 430 including first superconductor 402, insulator 412, interface layer 422, and dielectric 432 after operation 312.

Figure 4E:
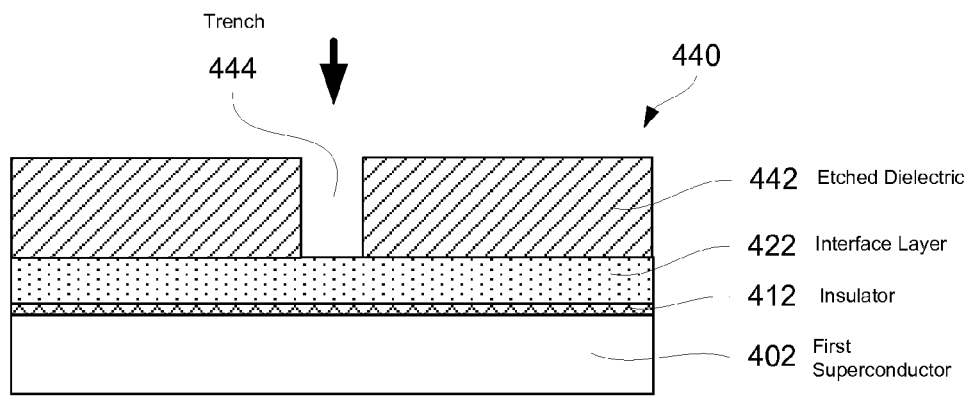

Returning to FIG. 3, the dielectric may be selectively etched during operation 314. Various lithographic and etching techniques known to one having ordinary skills in the art could be used during operation. Operation 314 involves forming a trench in the dielectric and exposing a portion of the interface layer. It should be noted that even though the portion of the interface layer is exposed, the insulator is protected from etchants by the interface layer. Overall, at least the portion of the third layer is exposed to an oxygen containing environment prior to forming a second superconductor. In some embodiments, method 300 may also involve cleaning the trench and/or the exposed surface of the interface layer during optional operation 316. FIG. 4E is a schematic representation of a partially fabricated assembly 440 including first superconductor 402, insulator 412, interface layer 422, and etched dielectric 442 after operation 314 or after operation 316. Etched dielectric 442 defines a trench 444, which exposes a portion of interface layer 422.

Figure 4F:
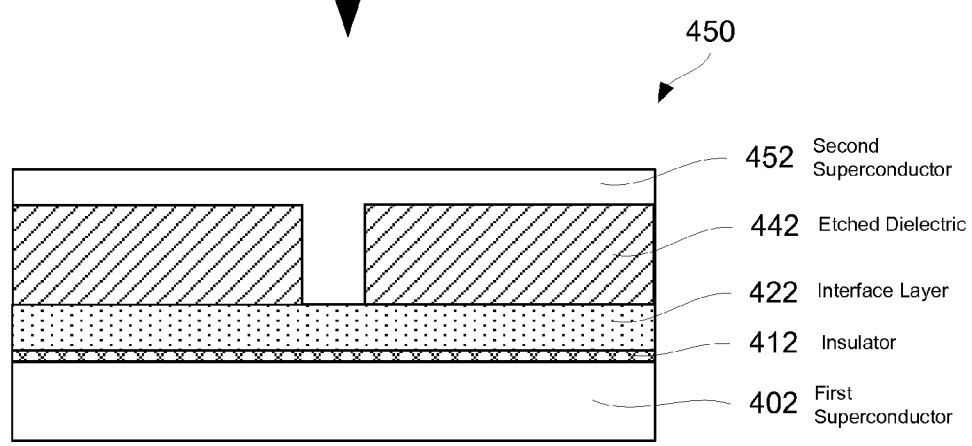

Returning to FIG. 3, method 300 may proceed with forming a second superconductor over the dielectric during operation 318. After completing operation 318, the second superconductor extends into and fills the trench and directly interfaces the portion of the interface layer. Specifically, FIG. 4F is a schematic representation of a partially fabricated assembly 450 including first superconductor 402, insulator 412, interface layer 422, etched dielectric 442, and second superconductor 452 after operation 318.

In some embodiments, method 300 also involves annealing the superconducting junction that includes at least the second superconductor directly interfaces the portion of the interface layer during optional operation 320. During this operation, oxygen is transferred from the second superconductor to the portion of the interface layer during annealing.

CONCLUSION

Although the foregoing concepts have been described in some detail for purposes of clarity of understanding, it will be apparent that certain changes and modifications may be practiced within the scope of the appended claims. It should be noted that there are many alternative ways of implementing the processes, systems, and apparatuses. Accordingly, the present embodiments are to be considered as illustrative and not restrictive.

What is claimed is:

1. A superconducting tunneling junction comprising:
a first layer operable as a first superconductor;
a second layer operable as an insulator;
a third layer operable as an interface layer; and
a fourth layer operable as a second superconductor,
wherein the third layer is disposed between the second layer and the fourth layer,
wherein the second layer is disposed between the first layer and the fourth layer,
wherein the second layer comprises a first oxide; and
wherein the third layer comprises a metal that reacts with oxygen to form a second oxide;
wherein at least a portion of the metal of the third layer is in a form of a conductive metal silicide or a metallic titanium;
wherein the second oxide is non-insulating below a critical temperature of the first layer and the fourth layer; and
wherein the second oxide is one of molybdenum oxide, ruthenium oxide, rhenium oxide, rhodium oxide, iridium oxide, manganese oxide, tin oxide, or cobalt oxide.

2. The superconducting tunneling junction of claim 1, wherein the superconducting tunneling junction is a Josephson tunneling junction.

3. The superconducting tunneling junction of claim 1, wherein the first layer and the fourth layer comprise niobium.

4. The superconducting tunneling junction of claim 1, wherein the second layer comprises aluminum oxide.

5. The superconducting tunneling junction of claim 4, wherein the second layer comprises metallic aluminum.

6. The superconducting tunneling junction of claim 1, wherein a thickness of the second layer is between about 0.5 nanometers and 2 nanometers.

7. The superconducting tunneling junction of claim 1, wherein the third layer comprises metallic titanium.

8. The superconducting tunneling junction of claim 1, wherein the third layer has an oxygen diffusion coefficient less than $10^{-9}$.

9. The superconducting tunneling junction of claim 1, further comprising a fifth layer disposed between the first layer and the second layer and operable as an additional interface layer.

10. The superconducting tunneling junction of claim 1, wherein a portion of the third layer comprises the second oxide.

11. The superconducting tunneling junction of claim 1, wherein the metal is titanium.

12. The superconducting tunneling junction of claim 1, wherein the second oxide is molybdenum oxide.

13. The superconducting tunneling junction of claim 1, wherein the second oxide is ruthenium oxide.

14. The superconducting tunneling junction of claim 1, wherein the second oxide is rhenium oxide.

15. The superconducting tunneling junction of claim 1, wherein the second oxide is rhodium oxide.

16. The superconducting tunneling junction of claim 1, wherein the second oxide is iridium oxide.

17. The superconducting tunneling junction of claim 1, wherein the second oxide is manganese oxide.

18. The superconducting tunneling junction of claim 1, wherein the second oxide is tin oxide.

19. The superconducting tunneling junction of claim 1, wherein the second oxide is cobalt oxide.

20. The superconducting tunneling junction of claim 1, wherein the metal silicide comprises the metal.

* * * * *